US007843292B2

(12) United States Patent
Remke et al.

(10) Patent No.: US 7,843,292 B2
(45) Date of Patent: Nov. 30, 2010

(54) COIL FOR PRODUCING A MAGNETIC FIELD

(75) Inventors: Stefan Remke, Tarragona (ES); Thomas Braun, Ettringen (DE); Jan Wiezoreck, Bonn (DE)

(73) Assignee: Zenergy Power GmbH, Rheinbach (DE)

( * ) Notice: Subject to any disclaimer, the term of this patent is extended or adjusted under 35 U.S.C. 154(b) by 357 days.

(21) Appl. No.: 12/084,511

(22) PCT Filed: Oct. 18, 2006

(86) PCT No.: PCT/EP2006/010038

§ 371 (c)(1),
(2), (4) Date: Apr. 30, 2008

(87) PCT Pub. No.: WO2007/051525

PCT Pub. Date: May 10, 2007

(65) Prior Publication Data

US 2009/0140831 A1 Jun. 4, 2009

(30) Foreign Application Priority Data

Nov. 2, 2005 (DE) ...................... 10 2005 052 602

(51) Int. Cl.

| | |
|---|---|
| ***H01F 7/00*** | (2006.01) |
| ***H01F 1/00*** | (2006.01) |
| ***H01F 6/00*** | (2006.01) |
| ***H01F 3/00*** | (2006.01) |
| ***H01L 23/48*** | (2006.01) |
| ***H01L 27/00*** | (2006.01) |
| ***H01L 39/24*** | (2006.01) |
| ***H01R 9/24*** | (2006.01) |

(52) U.S. Cl. ....................... 335/216; 335/219; 335/269; 335/299; 335/301; 505/190; 505/211; 505/220; 505/433; 505/434; 505/470; 505/739; 505/924; 336/DIG. 1; 257/661; 439/884

(58) Field of Classification Search ................. 335/216, 335/219, 296, 299, 301; 505/211, 924, 430, 505/433, 705, 220, 190, 434, 452, 470, 739; 336/DIG. 1; 257/661; 439/884
See application file for complete search history.

(56) References Cited

U.S. PATENT DOCUMENTS 3,200,299 A * 8/1965 Autler ........................ 361/141

(Continued)

FOREIGN PATENT DOCUMENTS

EP 0472333 2/1992

(Continued)

OTHER PUBLICATIONS

International Search Report for PCT/EP2006/010038.

(Continued)

*Primary Examiner*—Anh T Mai
*Assistant Examiner*—Mohamad A Musleh
(74) *Attorney, Agent, or Firm*—Fay Sharpe LLP

(57) ABSTRACT

The invention relates to a coil for producing a magnetic field having at least one winding (12), which is manufactured from a superconductor, is cast into a plastic and whose winding end (19) which is arranged at the circumference (13) of the winding (12) is used for making contact with an electrical conductor (15). In order to provide coils with windings (12) consisting of superconductors which make robust contact-making possible given simple production, an electrically conductive connection piece (30) with a base region (31), which is connected to the winding end (19), and a top region (32) for connecting the conductor (15) is provided for contact-making purposes, the base region (31) of said connection piece (30) being covered partially in the radial direction by a reinforcing insert (14), which is cast into the plastic (20) and at least partially surrounds the winding (12).

48 Claims, 3 Drawing Sheets

U.S. PATENT DOCUMENTS

| | | | | |
|---|---|---|---|---|
| 3,545,078 | A | 12/1970 | Lightner | |
| 4,270,112 | A * | 5/1981 | Schneider-Muntau et al. | 336/197 |
| 4,544,979 | A * | 10/1985 | Ennis et al. | 361/19 |
| 5,369,387 | A * | 11/1994 | Woods et al. | 335/216 |
| 5,686,876 | A * | 11/1997 | Yamamoto et al. | 335/216 |
| 5,691,679 | A * | 11/1997 | Ackermann et al. | 335/216 |
| 5,914,647 | A * | 6/1999 | Aized et al. | 335/216 |
| 7,049,920 | B2 * | 5/2006 | Yoshino et al. | 335/301 |
| 2003/0173103 | A1 * | 9/2003 | Morita et al. | 174/125.1 |

FOREIGN PATENT DOCUMENTS

| | | | |
|---|---|---|---|
| GB | 191550 | | 1/1923 |
| JP | 60059724 | | 4/1985 |
| JP | 01286729 | A * | 11/1989 |

OTHER PUBLICATIONS

International Preliminary Report on Patentability and Written Opinion of the International Searching Authority dated Jun. 19, 2008 in connection with International Appln. No. PCT/EP2006/010038, filed October 18, 2006.

* cited by examiner

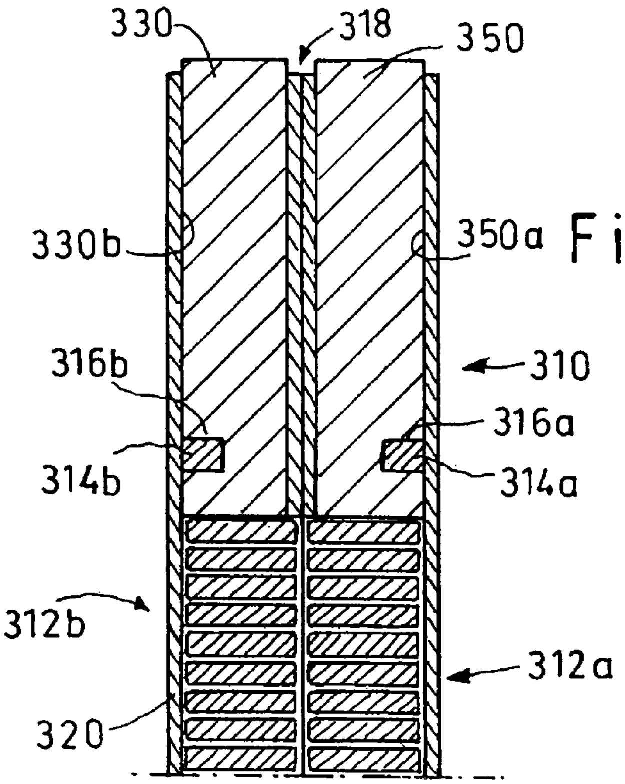
Fig.5
Fig.6
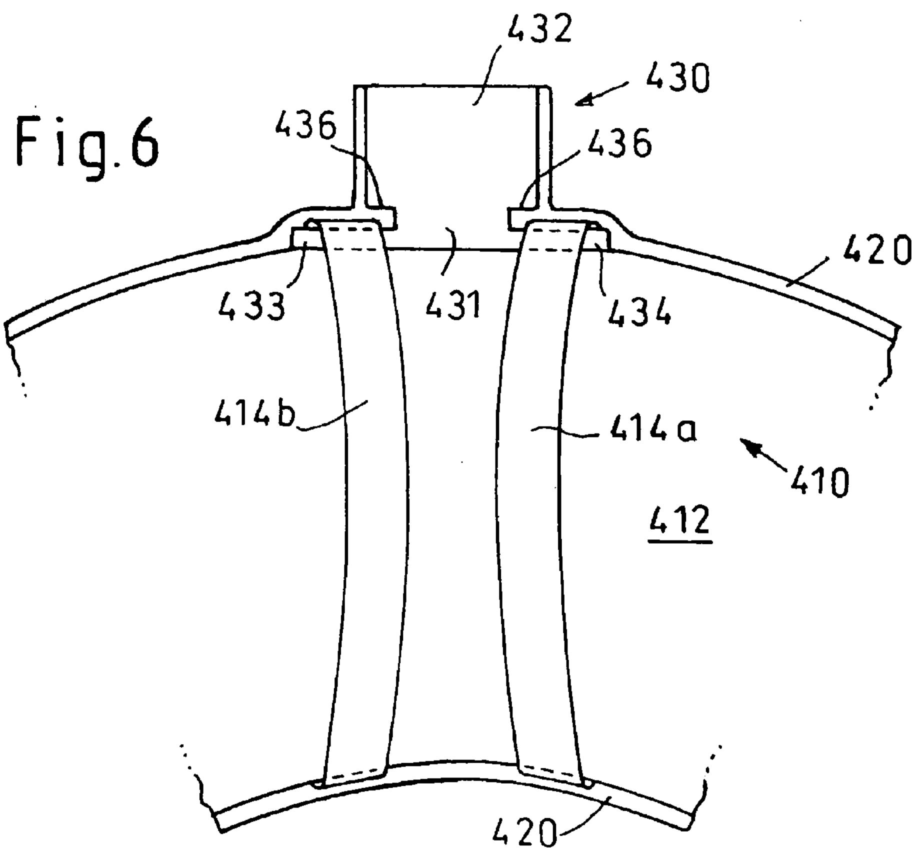

COIL FOR PRODUCING A MAGNETIC FIELD

CROSS REFERENCE TO RELATED APPLICATION

This application claims priority to and the benefit of the filing date of International Application No. PCT/EP2006/010038, filed Oct. 18, 2006, which application claims priority to and the benefit of the filing date of German Application No. 10 2005 052 602.0, filed Nov. 2, 2005.

The invention relates to a coil for producing a magnetic field, having at least one winding, which is manufactured from a superconductor and is encapsulated in a plastic, with a winding end which is arranged on the circumference of the winding being used as a contact for an electrical conductor.

BACKGROUND OF THE INVENTION

Coils having a winding manufactured from a superconductor are used for construction of motors, generators and magnets when the aim is to exploit the benefits of the low resistance of cooled superconductors. High-temperature superconductors are frequently used, which are composed of a brittle composite of ceramic and metal but cannot withstand major tensile or shear forces even at room temperature, and in particular at lower temperatures. Furthermore, superconductors lose even more of their elasticity, which is low even at room temperature, when cooled down. When coils are installed, contact is generally made with the winding end by soldering on a metallic or superconducting conductor. Tensile and shear forces transmitted to the soldered-on conductor can damage the winding, as a result of which the winding may in the worst case be destroyed if the contact is not handled carefully.

SUMMARY OF THE INVENTION

The present invention is to provide coils with windings composed of superconductors which can be easily produced with a robust contact and in which the risk of damage to the winding is reduced.

According to an aspect of the invention, the contact has an electrically conductive connecting piece with a foot area, which is connected over an area to the winding end, and with a head area for connection of the conductor, with the foot area being partially covered in the radial direction by a reinforcing insert which is encapsulated in the plastic and at least partially surrounds the winding. This has the advantage that the connecting piece is stabilized with respect to the winding by means of the reinforcing insert encapsulated in the plastic. Any forces which may act on the connecting piece are transmitted over a large area through the reinforcing insert to the plastic surrounding the coil, thus relieving the load from these forces, in particular on the winding end.

The reinforcing insert, complemented by the connecting piece, can completely surround the winding, thus preventing local compression and tension loads on the winding. The reinforcing insert and the connecting piece can form an intrinsically closed strain relief means. In one advantageous embodiment, the reinforcing insert comprises a ring surrounding the winding, in particular such as a prefabricated sufficiently robust strip or split annular bodies.

According to another aspect, the foot area may have limbs on both opposite side faces, as a result of which the foot area can rest over a large area on the winding end, and the reinforcing insert can also cover the limbs at the winding end over a large area. These limbs may project beyond the side faces of the connecting piece in the head area in the circumferential direction. In one particularly advantageous refinement, the reinforcing insert then covers both limbs and extends from one limb to the other along the circumference of an outer turn of the winding, thus providing a surrounding cover for the winding, along the circumference. This surrounding cover protects the coil against mechanical shocks on the circumference of the winding. In one alternative refinement, two reinforcing inserts may be arranged transversely with respect to the winding, in each case covering one of the limbs at the side and then surrounding the winding at the side, on the front face and rear face. The reinforcing inserts can then preferably pass through a winding former, on which the winding is wound, in order to completely surround the winding. Alternatively, the reinforcing insert can be attached to the winding former so that the connecting piece is supported on the winding former via the reinforcing insert.

Irrespective of the arrangement of the reinforcing insert on the winding, it is advantageous for the reinforcing insert to engage in at least one recess between the head area and the foot area, in particular in an interlocking manner, thus likewise stabilizing the connecting piece. The connecting piece may have a recess in the form of a groove on each of its two side faces, in which the reinforcing insert, if it extends along the circumference, engages with both end faces, or through which it passes. If two reinforcing inserts are arranged on the front face and rear face transversely with respect to the winding, they can engage in the recesses at the side. The reinforcing insert can also be firmly clamped in the recesses.

In one embodiment, the plastic is an electrical impregnation compound or an encapsulation compound. The encapsulation or impregnation of the coil in plastic is can be carried out by vacuum impregnation or using the vacuum impregnation process, with the plastic advantageously being composed of a resin, in particular an epoxy resin. The coil is can be in the form of a double-disk coil which is formed by two windings which are arranged alongside one another, are wound in opposite senses and merge into one another on the winding inner face, so that the two winding ends are arranged on the circumference and are each provided with a connecting piece. These double-disk coils are also referred to as “double-pancake coils”, and have the advantage that contact is made on the easily accessible circumference. The two connecting pieces are expediently arranged parallel to one another, and isolated from one another by a gap. An isolating layer can furthermore expediently be arranged in the gap.

The winding is preferably manufactured from a high-temperature superconductor, which has the advantage that the coil can be cooled by nitrogen, although without being restricted to this. The winding is expediently wound from a ribbon conductor or layers formed from ribbon conductors, which can be manufactured using the “powder in tube” technique, or in the form of a thin-film conductor. A solder with a high melting temperature is preferably used for soldering the foot area to the winding end. A conductor can then be soldered to the head area using a solder with a lower melting temperature, without any possibility of melting of the solder at the foot area. By way of example, commercially available electrical solder can be used for the solder at the head area.

BRIEF DESCRIPTION OF DRAWINGS

Further advantages and refinements of the invention will become evident from the following description of exemplary embodiments for coils according to the invention as illustrated in the drawing, in which:

FIG. 5 shows a vertical section through the upper coil half of a double-disk coil with a third exemplary embodiment of a connecting piece; and FIG. 6 shows a detailed view of a coil with a connecting piece according to a fourth exemplary embodiment, and with a reinforcing insert running transversely with respect to the winding.

DESCRIPTION OF PREFERRED EMBODIMENTS

Figure 1:
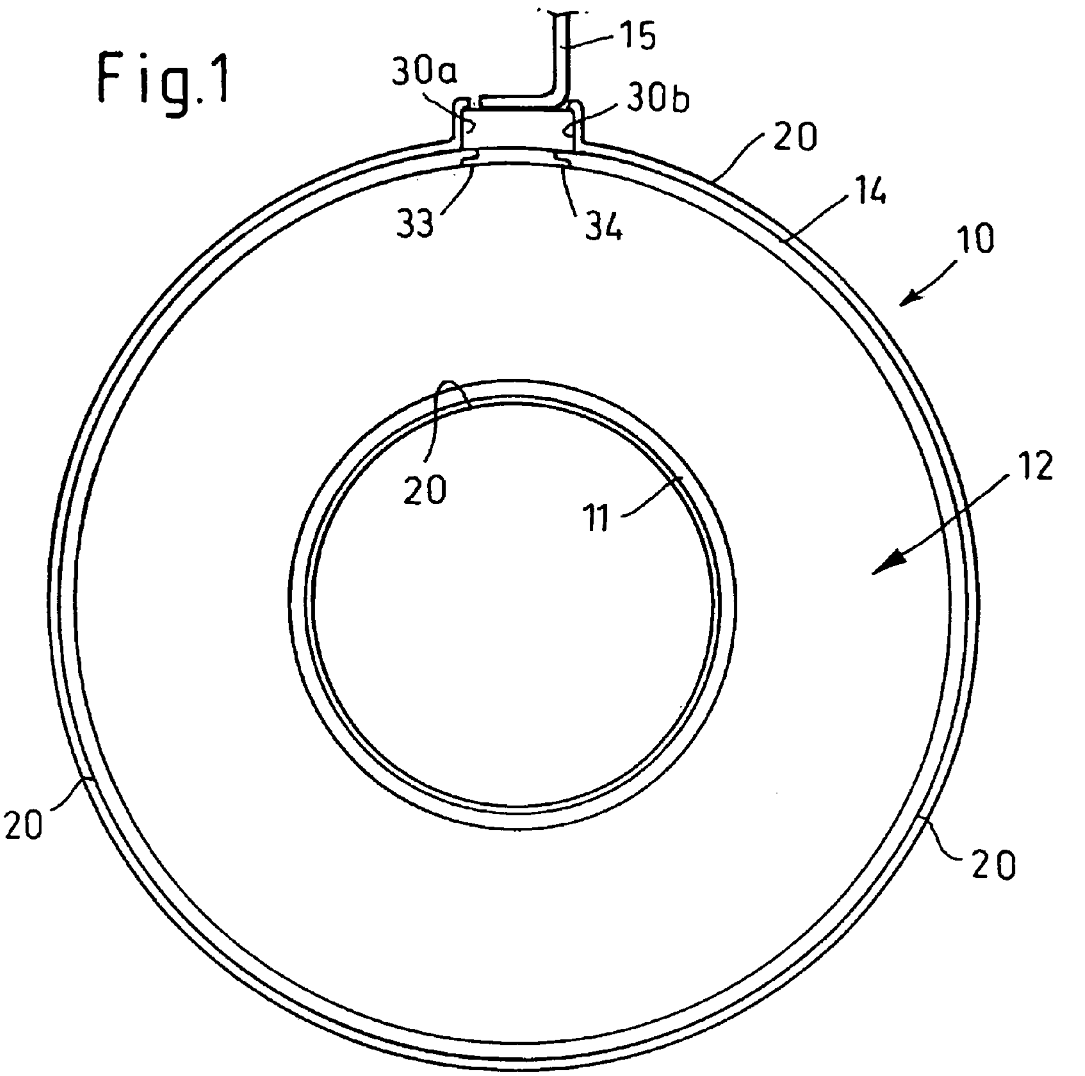
FIG. 1 shows a schematic view of the front face of a coil according to the invention with a connecting piece according to a first exemplary embodiment.

Referring now in greater detail to the drawings wherein the showings are for the purposes of illustrating preferred embodiments of the invention only, and not for purposes of limiting the invention, FIG. 1 shows, schematically, a coil 10 for producing a magnetic field and having a winding 12 which is wound on a tubular winding former 11. The winding 12 comprises a ribbon conductor which is wound with superposed turns one on top of the other and is manufactured using the "powder in tube" technique from a ceramic high-temperature superconductor. A thin-film conductor or a stack of thin-film conductors can also be used for this purpose. A connecting piece 30 is used to make contact with the winding 12. The connecting piece 30 is in the form of a block in this case, is composed of copper and has a recess 36 in the form of a slot in each case between a foot area 31 and a head area 32 on both side faces 30*a*, 30*b* pointing in the circumferential direction or winding direction, thus forming a short limb 33 on the side face 30*a* and a short limb 34 on the side face 30*b* at the foot area 31. The foot area 31 is soldered to the longitudinal faces of the connecting piece 30 on the circumference 13 of the winding 12. As can be seen from FIG. 2, the foot area 31 in this case rests flat over an area on a winding end 19 of the winding 12, and is attached by soldering, which is not illustrated. An electrically conductive supply line 15 is soldered to the head area 32 of the connecting piece 30 and in one embodiment comprises a normal conductor or a further superconductor.

A reinforcing insert 14 rests on the circumference 13 of the winding 12 and extends from the side face 30*a* of the connecting piece 30 along the circumference 13 to the other side face 30*b*. As can be seen from FIG. 2, each of the ends of the reinforcing insert 14 in this case engages in the recesses 36, thus covering the two limbs 33, 34. Together with the tubular winding former 11, the reinforcing insert 14 and the connecting piece 30, the winding 12 is encapsulated in epoxy resin 20. The reinforcing insert 14 may comprise a reinforcing strip or a ring of adequate intrinsic stiffness, and/or fiber reinforcement. The reinforcing insert may, however, also be composed of loose or bonded reinforcing fibers, such as glass fibers, which are encapsulated in the plastic as well. The reinforcing insert 14 and the connecting piece 30 which is partially covered by it in the foot area thus form an intrinsically closed strain relief means for the contact. The effect of the reinforcing insert 14 is particularly good since they partially cover the foot area 31 of the connecting piece 30 in the radial direction, specifically in the area of the two short limbs 33, 34.

Figure 2:
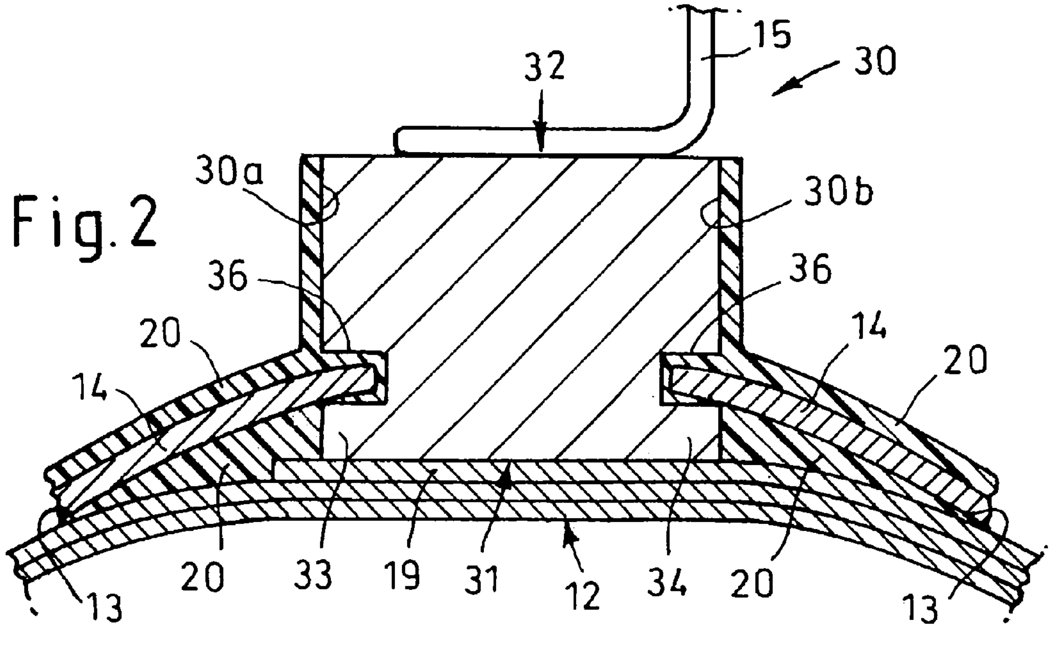
FIG. 2 shows a detailed section view of the coil from FIG. 1.
Figures 3, 4:
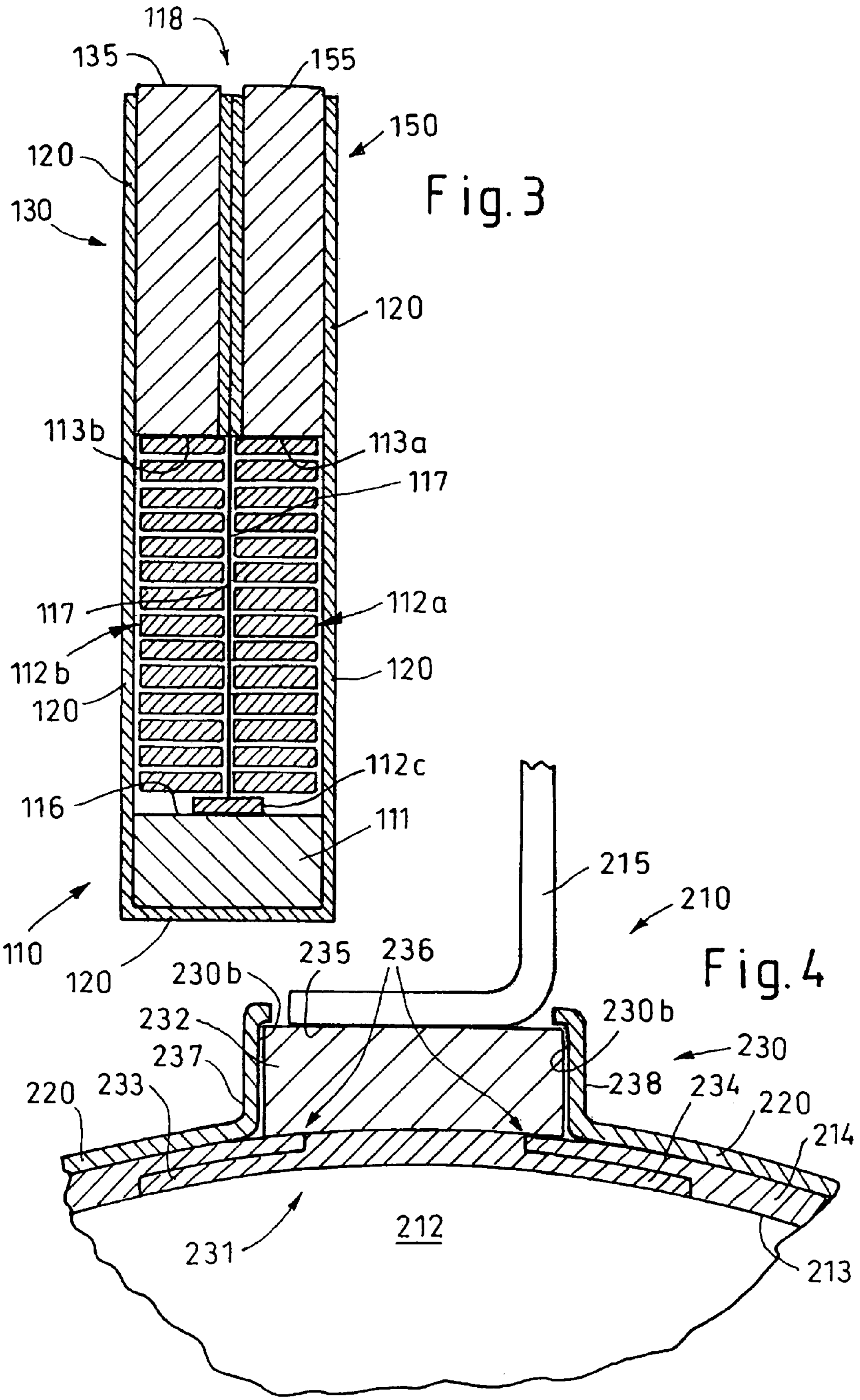
FIG. 3 shows a vertical section through the upper coil half of a double-disk coil with connecting pieces arranged on it.
FIG. 4 shows a detailed view similar to FIG. 2, with a connecting piece according to a second exemplary embodiment.

FIG. 3 shows another embodiment with two windings 112*a* and 112*b* which are connected to one another, are wound in opposite senses and in this case form a so-called "double-pancake" or double-disk coil 110. The windings 112*a*, 112*b* are wound from a ribbon superconductor. The windings 112*a* and 112*b* merge into one another over a common inner turn 112*c* on the outer circumference 116 of the winding former 111. A connecting piece 150 is soldered to the outer circumference 113*a* of the winding 112*a*, and a second connecting piece 130 is soldered to the outer circumference 113*b* of the winding 112*b*, which connecting pieces 150, 130 are physically identical to the connecting piece 30 as illustrated in FIG. 1. In order to avoid repetition, reference is made here to the description of the connecting piece 30 illustrated in FIGS. 1 and 2.

The two connecting pieces 130, 150 are arranged parallel to one another and alongside one another, and are separated from one another by an isolating gap 118. The winding parts 112*a* and 112*b* are isolated from one another by an isolating layer 117, which extends further into the gap 118 between the two connecting pieces 130, 150. Once the connecting pieces 130, 150 have been soldered to the winding ends and the reinforcing inserts 113*a*, 113*b* have been placed around the windings 112*a*, 112*b*, the entire coil 110 is encapsulated in epoxy resin 120, which also fills the gap 118 as additional insulation and covers the side surfaces of the connecting pieces 130, 150. Only the head faces 135 and 155 of the connecting pieces are free of the epoxy resin 120, in order to allow normal conductors to be soldered to the connecting pieces 130, 150 of the coil 110, in order to make electrical contact with the windings 112*a* and 112*b*.

FIG. 4 shows a coil 210 with a connecting piece 230 manufactured from copper, according to a further exemplary embodiment, which is soldered over a large area to a winding 212 with limbs 233, 234 which project beyond a head area 232 in the winding direction or circumferential direction. The connecting piece 230 is connected to the winding 212 in a very highly conductive manner by means of the long limbs 233, 234. The connecting piece 230 is provided with two slotted recesses 236 between the head area 232 and a foot area 231, in which the ends of a reinforcing insert 214 engage. The winding 212, the reinforcing insert 214 and the connecting piece 230 are encapsulated in epoxy resin 220. Two S-shaped holding layers 237 and 238 lie on the side faces 230*a* and 230*b* (which have the recesses 236) of the head area 232 and are composed of a glass-fiber non-woven, which is likewise encapsulated in the epoxy resin 220, which holding layers 237 and 238 partially clasp the head face 235 of the head area 232, so that the head area 232 is also stabilized by the holding layers 237, 238. A supply line 215 is soldered to the head face 235.

FIG. 5 shows a double-disk coil 310 with a first winding 312*a* and a second winding 312*b* composed of a ribbon superconductor, as described in FIG. 3, which are soldered to two connecting pieces 330 and 350. The connecting piece 350 is provided with a slotted recess 316*a* along its outer longitudinal face 350*a*, and the connecting piece 330 is provided with a slotted recess 316*b*, extending in the winding direction, on its outer longitudinal face 330*b*. An annular reinforcing insert 314*a* is inserted into the recess 316*a*, and an annular reinforcing insert 314*b* is inserted into the recess 316*b*. The solid, possibly closed, rings 314*a*, 314*b* surround the windings 312*a*, 312*b* along their circumference, and in this case are encapsulated with the windings 312*a*, 312*b* in an epoxy resin 320. Instead of annular reinforcing inserts 314*a*, 314*b*, fibers or fiber mats or the like could also be inserted into the side recesses 316*a*, 316*b*.

FIG. 6 shows a winding 412 on a coil 410 with a connecting piece 430 which, in a similar manner to the connecting piece shown in FIG. 4, is provided on its side faces with limbs 433, 434 which lengthen the foot area 431 in the circumferential direction and project beyond the side faces of the head area 432. Above the limbs 433, 434, the connecting piece 430 is provided with two slotted recesses 436. One limb 434 is covered by a first reinforcing insert 414*a*, which runs transversely with respect to the winding 412, and the other limb 433 is covered by a second reinforcing insert 414*b*, which likewise runs transversely with respect to the winding 412. The two reinforcing inserts 414*a*, 414*b* comprise, for example, a plurality of glass-fiber strips, which together surround the winding 412 and are encapsulated with the connecting piece 430 and the winding 412 in a plastic 420. The two reinforcing inserts may in this case engage in an inner opening in a winding former, or may pass through it, so that the connecting piece 430 is fixed to two limbs 433, 434 in the radial direction relative to the winding former.

In the exemplary embodiments which are illustrated in the figures, in particular in FIGS. 2 and 4, the head area 32, 232 of the connecting piece 30, 230 projects somewhat radially beyond the reinforcing insert 14, 214 and the plastic 20, 220 in which it is embedded. The projecting subarea in these exemplary embodiments could also be removed subsequently, for example by being ground off or removed, so that it can endflush with the plastic in which the reinforcing insert is encapsulated, or else a connecting piece (not shown) is used during an assembly process which has only a head area which is short in the radial direction and projects beyond the limbs and the foot area which, after being encapsulated or embedded in plastic, once again, it can endflush with the plastic. In this refinement, it would then also be possible not to form any recesses between the foot area and the head area for the ends of the reinforcing inserts to engage in.

For a person skilled in the art, numerous modifications will be evident, and equivalence thereto from the description and these are intended to be covered by the scope of protection of the attached claims.

The invention claimed is:

1. A coil for producing a magnetic field, having at least one winding which is manufactured from superposed turns of a superconductor and is encapsulated in a plastic, with a winding end which is arranged on the circumference of the winding being used as a contact for an electrical conductor, the contact having an electrically conductive connecting piece with a foot area, which is connected over an area to the winding end, and with a head area for connection of the conductor, with the foot area of the connecting piece including limbs which rest directly on the winding end and which are at least partially covered in the radial direction by a reinforcing insert which is encapsulated in the plastic and at least partially surrounds the winding, wherein the connecting piece has a recess in the form of a groove on both side faces of the connecting piece, the reinforcing insert engaging the groove.

2. The coil as claimed in claim 1, wherein the reinforcing insert together with the connecting piece completely surrounds the winding.

3. The coil as claimed in claim 1, wherein the reinforcing insert and the connecting piece form an intrinsically closed strain relief means.

4. The coil as claimed in claim 1, wherein the reinforcing insert comprises a ring surrounding the winding.

5. The coil as claimed in claim 1, wherein the limbs are arranged on two opposite side faces of the foot area.

6. The coil as claimed in claim 5, the limbs project beyond the head area in the circumferential direction.

7. The coil as claimed in claim 1, wherein the reinforcing insert covers both limbs and extends from one limb to the other along the circumference of an outer turn of the winding.

8. The coil as claimed in claim 1, wherein each limb is covered at the side by the reinforcing insert and the reinforcing insert extending along a front face and a rear face of the winding.

9. The coil as claimed in claim 8, wherein the reinforcing insert passes through or engages at least one of a winding inner face and a winding former.

10. The coil as claimed in claim 1, wherein the reinforcing insert engages at least one recess between the head area and the foot area.

11. The coil as claimed in claim 1, wherein the reinforcing insert interengages with the groove.

12. The coil as claimed in claim 1, wherein the reinforcing insert is fiber-reinforced.

13. The coil as claimed in claim 1, wherein the plastic is applied by vacuum impregnation.

14. The coil as claimed in claim 1, wherein the plastic is at least partially formed by an epoxy resin.

15. The coil as claimed in claim 1, wherein the at least one winding includes a first and a second winding, the first and the second winding being arranged alongside one another and are wound in opposite senses, the first and the second windings being connected to a winding inner face thereby forming a double-disk coil whose two winding ends are arranged on the circumference and are each provided with a connecting piece.

16. The coil as claimed in claim 15, wherein the connecting piece is at least two connecting pieces arranged parallel to one another and isolated from one another by a gap.

17. The coil as claimed in claim 16, further including an isolating layer in the gap.

18. The coil as claimed in claim 1, wherein the foot area is soldered over an area to the winding end.

19. The coil as claimed in claim 18, wherein the foot area is soldered using a solder with a high melting temperature.

20. The coil as claimed in claim 19, wherein the solder used to solder the foot area is a first solder and the conductor is soldered to the head area with a second solder, the first solder having a higher melting temperature than the second solder.

21. The coil as claimed in claim 1, wherein the winding is manufactured from a high-temperature superconductor.

22. The coil as claimed in claim 1, wherein the winding is wound from a ribbon conductor.

23. The coil as claimed in claim 22, wherein the ribbon conductor is one of manufactured using a "powder in tube" technique or a thin-film conductor.

24. The coil as claimed in claim 1, wherein the head area of the connecting piece ends flush in the radial direction with one of the circumference of the coil and the plastic in which the reinforcing insert is encapsulated.

25. A coil for producing a magnetic field, having at least one winding which is manufactured from superposed turns of a superconductor and is encapsulated in a plastic, with a winding end which is arranged on the circumference of the winding being used as a contact for an electrical conductor, the contact having an electrically conductive connecting piece with a foot area, which is connected over an area to the winding end, and with a head area for connection of the conductor, with the foot area of the connecting piece including limbs which rest directly on the winding end and which are at least partially covered in the radial direction by a reinforcing insert which is encapsulated in the plastic and at least partially surrounds the winding, wherein the limbs project beyond the head area in the circumferential direction.

26. The coil as claimed in claim 25, wherein the reinforcing insert together with the connecting piece completely surrounds the winding.

27. The coil as claimed in claim 25, wherein the reinforcing insert and the connecting piece form an intrinsically closed strain relief means.

28. The coil as claimed in claim 25, wherein the reinforcing insert comprises a ring surrounding the winding.

29. The coil as claimed in claim 25, wherein the limbs are arranged on two opposite side faces of the foot area.

30. The coil as claimed in claim 25, wherein the reinforcing insert covers both limbs and extends from one limb to the other along the circumference of an outer turn of the winding.

31. The coil as claimed in claim 25, wherein each limb is covered at the side by the reinforcing insert and the reinforcing insert extending along a front face and a rear face of the winding.

32. The coil as claimed in claim 25, wherein the reinforcing insert passes through or engages at least one of a winding inner face and a winding former.

33. The coil as claimed in claim 25, wherein the reinforcing insert engages at least one recess between the head area and the foot area.

34. The coil as claimed in claim 25, wherein the connecting piece has a recess in the form of a groove on both side faces of the connecting piece, the reinforcing insert engaging the groove.

35. The coil as claimed in claim 25, wherein the reinforcing insert interengages with the groove.

36. The coil as claimed in claim 25, wherein the reinforcing insert is fiber-reinforced.

37. The coil as claimed in claim 25, wherein the plastic is applied by vacuum impregnation.

38. The coil as claimed in claim 25, wherein the plastic is at least partially formed by an epoxy resin.

39. The coil as claimed in claim 25, wherein the at least one winding includes a first and a second winding, the first and the second winding being arranged alongside one another and are wound in opposite senses, the first and the second windings being connected to a winding inner face thereby forming a double-disk coil whose two winding ends are arranged on the circumference and are each provided with a connecting piece.

40. The coil as claimed in claim 39, wherein the connecting piece is at least two connecting pieces arranged parallel to one another and isolated from one another by a gap.

41. The coil as claimed in claim 40, further including an isolating layer in the gap.

42. The coil as claimed in claim 25, wherein the foot area is soldered over an area to the winding end.

43. The coil as claimed in claim 42, wherein the foot area is soldered using a solder with a high melting temperature.

44. The coil as claimed in claim 43, wherein the solder used to solder the foot area is a first solder and the conductor is soldered to the head area with a second solder, the first solder having a higher melting temperature than the second solder.

45. The coil as claimed in claim 25, wherein the winding is manufactured from a high-temperature superconductor.

46. The coil as claimed in claim 25, wherein the winding is wound from a ribbon conductor.

47. The coil as claimed in claim 46, wherein the ribbon conductor is one of manufactured using a "powder in tube" technique or a thin-film conductor.

48. The coil as claimed in claim 25, wherein the head area of the connecting piece ends flush in the radial direction with one of the circumference of the coil and the plastic in which the reinforcing insert is encapsulated.

* * * * *